(12) United States Patent
Michiels et al.

(10) Patent No.: US 6,573,023 B2
(45) Date of Patent: Jun. 3, 2003

(54) STRUCTURES AND STRUCTURE FORMING METHODS

(75) Inventors: John Michiels, Boise, ID (US); David Wells, Boise, ID (US); Eric J. Knappenberger, Meridian, ID (US); James J. Alwan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/458,758

(22) Filed: Dec. 10, 1999

(65) Prior Publication Data

US 2002/0076620 A1 Jun. 20, 2002

Related U.S. Application Data

(62) Division of application No. 09/141,809, filed on Aug. 28, 1998, now Pat. No. 6,228,538.

(51) Int. Cl.[7] ............................. G03C 5/00; G03C 1/76; G03F 9/00
(52) U.S. Cl. ..................... 430/270.1; 430/5; 430/308; 430/313; 430/322; 430/330
(58) Field of Search ............................. 430/5, 6, 8, 322, 430/323, 324, 300, 302, 304, 306, 950, 270.1, 271.1, 311, 312, 313, 308, 330

(56) References Cited

U.S. PATENT DOCUMENTS

| | | | |
|---|---|---|---|
| 3,485,658 A | 12/1969 | Iler | 117/69 |
| 4,407,695 A | * 10/1983 | Deckman et al. | 156/643 |
| 4,410,562 A | 10/1983 | Nemoto et al. | 427/54.1 |
| 4,522,910 A | 6/1985 | Hallman | 430/157 |
| 4,627,988 A | 12/1986 | Spanjer | 427/5 |
| 4,701,019 A | 10/1987 | Fitzpatrick | |

(List continued on next page.)

OTHER PUBLICATIONS

Website—www.yahoo.com 4 pages, Yahoo! 1Source Screen Printing; Feb. 18, 2002.
Website www.usscreen.com/catalog pp. 1–2, U.S. Screen Printing Institute; Feb. 18, 2002.
Website—http://tasp.home.texas.net/educ.html pp. 1–9, Solution's Journal, Insight, Advice & Lessons Learned; Feb. 18, 2002.
Website www.usscreen.com/articles/basicprinting.html pp. 1–5, Scott Fresener, Basic Printing Techniques 101; Feb. 18, 2002.
Website http://nuclear.hazard.uiuc.edu/packets/printing/screen.html pp. 1–4 of 24, Screen Printing; Feb. 14, 2002.
Website—www.stmediagroup.com 1 pg., ST Publications Screen Printing; Feb. 14, 2002.

(List continued on next page.)

*Primary Examiner*—Mark F. Huff
*Assistant Examiner*—Saleha Mohamedulla
(74) *Attorney, Agent, or Firm*—Wells St. John P.S.

(57) ABSTRACT

The present invention includes structures, lithographic mask forming solutions, mask forming methods, field emission display emitter mask forming methods, and methods of forming plural field emission display emitters. One aspect of the present invention provides a mask forming method including forming a masking layer over a surface of a substrate; screen printing plural masking particles over a surface of the masking layer; and removing at least portions of the masking layer using the masking particles as a mask. Another aspect of the present invention provides a method of forming plural field emission display emitters. This method includes forming a masking layer over an emitter substrate; screen printing a plurality of masking particles over the masking layer; removing portions of the masking layer intermediate the screen printed masking particles to form a plurality of masking elements; removing the masking particles from the masking elements; and removing portions of the emitter substrate to form plural emitters.

23 Claims, 6 Drawing Sheets

U.S. PATENT DOCUMENTS

| | | | |
|---|---|---|---|
| 4,752,353 A | | 6/1988 | Blanding et al. ............ 156/660 |
| 5,220,725 A | | 6/1993 | Chan et al. .................... 29/874 |
| 5,229,331 A | | 7/1993 | Doan et al. ................. 437/228 |
| 5,245,248 A | | 9/1993 | Chan et al. ................. 313/309 |
| 5,359,928 A | * | 11/1994 | Blessington et al. ..... 101/128.4 |
| 5,372,973 A | | 12/1994 | Doan et al. ................. 437/228 |
| 5,391,259 A | | 2/1995 | Cathey et al. .............. 156/643 |
| 5,399,238 A | | 3/1995 | Kumar ......................... 156/643 |
| 5,464,729 A | * | 11/1995 | Hoebener et al. ........... 430/396 |
| 5,510,156 A | | 4/1996 | Zhao .......................... 427/534 |
| 5,660,570 A | | 8/1997 | Chan et al. .................... 29/874 |
| 5,676,853 A | | 10/1997 | Alwan ......................... 216/11 |
| 5,695,658 A | | 12/1997 | Alwan ......................... 216/42 |
| 5,817,373 A | | 10/1998 | Cathey et al. .............. 427/458 |
| 5,871,870 A | | 2/1999 | Alwan .......................... 430/5 |
| 6,228,538 B1 | * | 5/2001 | Michiels et al. ............... 430/5 |

OTHER PUBLICATIONS

Website www.screenweb.com/resources pp. 1–2, Screen-Web, the Internet's Largest Screenprinting Resource; Feb. 18, 2002.

*Generation of Charged Liquid Cluster Beam of Liquid–Mix Precursors and Application to Nanostructured Materials*, K. Kim and C.K. Ryu, May 1994, pp. 597–602.

*Material Science and Engineering 621.02; Experiment No. 5; Silk screening of Ag paste and Ag/AgCl onto carbon films.;* Dr. Marc J. Madou; http://www.cts.com/browse/nanogen/home/classes/MSE621.02/lab5.html; pp. 1–2, (1999).

* cited by examiner

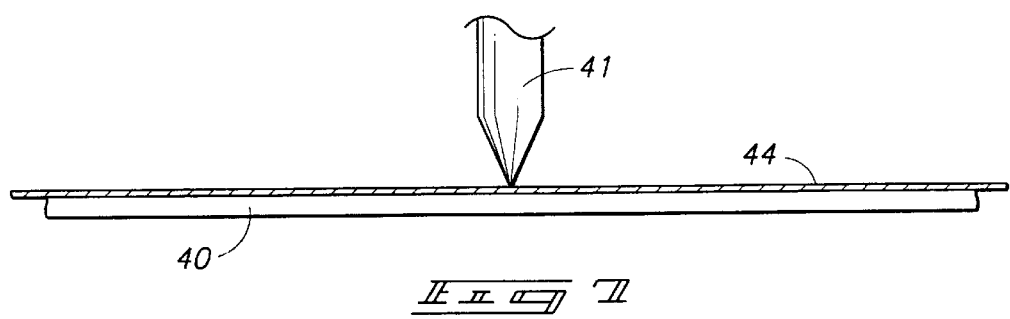
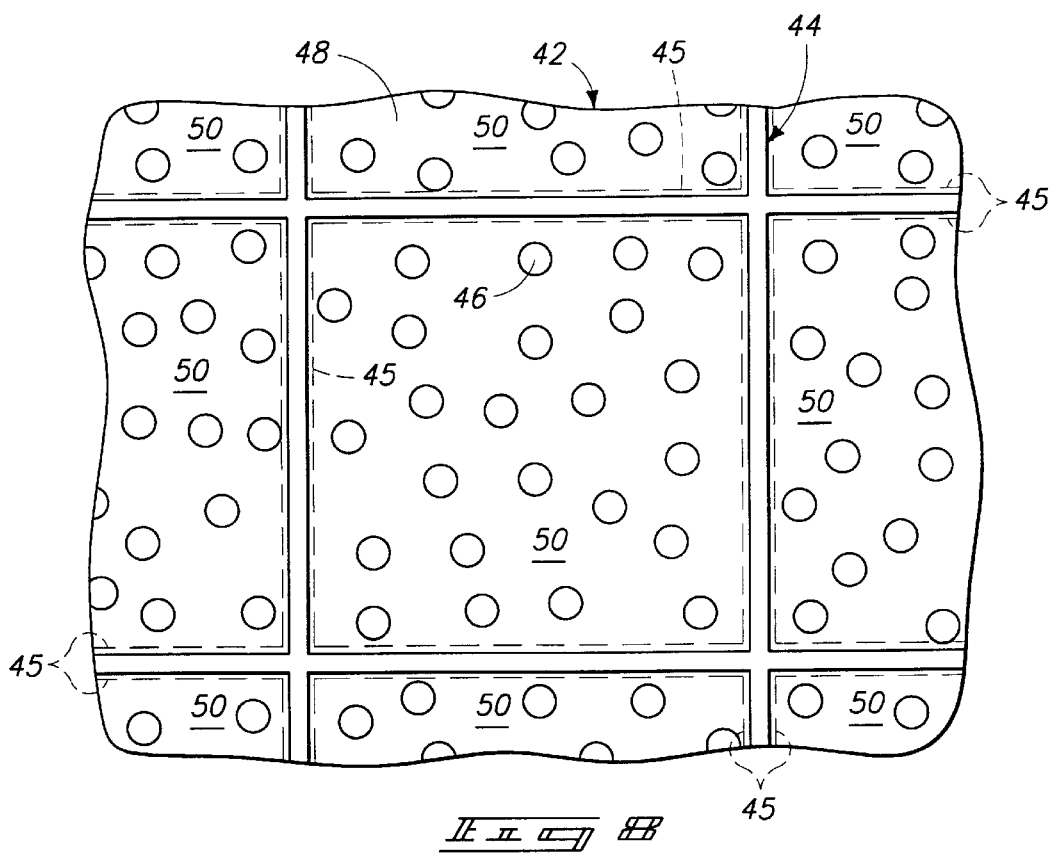

STRUCTURES AND STRUCTURE FORMING METHODS

CROSS REFERENCE TO RELATED APPLICATION

This patent resulted from a divisional application of U.S. patent application Ser. No. 09/141,809 filed Aug. 28, 1998, now U.S. Pat. No. 6,228,538 entitled "Structures, Lithographic Mask Forming Solutions, mask Forming Methods, Field Emission Display Emitter Mask Forming Methods, and Methods of Forming Plural Field Emission Display Emitters", naming John J. Michiels et al. as inventors the disclosure of which is incorporated by reference.

PATENT RIGHTS STATEMENT

This invention was made with Government support under Contract No. DABT63-97-C-0001 awarded by Advanced Research Projects Agency (ARPA). The Government has certain rights in this invention.

TECHNICAL FIELD

The present invention relates to structures, lithographic mask forming solutions, mask forming methods, field emission display emitter mask forming methods, and methods of forming plural field emission display emitters.

BACKGROUND OF THE INVENTION

Field emission displays are utilized in a variety of display applications. Conventional field emission displays include a cathode plate having a series of emitter tips fabricated thereon. The tips are configured to emit electrons toward a phosphor screen to produce an image. The emitters or emitter tips are typically formed from an emitter material such as conductive polysilicon, molybdenum, or aluminum. Multiple emitters are typically utilized to excite a single pixel. For example, 120 emitters may be used for a single pixel. Individual pixels contain a deposited one of red, green, or blue phosphor.

One method of fabrication of emitter tips is described in U.S. Pat. No. 5,391,259 (the '259 patent); assigned to the assignee hereof and incorporated by reference. A hardmask layer is formed over emitter material in the disclosed fabrication method. Portions of the hardmask layer are selectively removed to form a hardmask utilized for emitter fabrication. One conventional method utilizes photolithography and etching to selectively remove portions of the hardmask layer. Following the formation of the hardmask, the emitter material is etched isotropically to form the tips. For proper fabrication, it is highly desired that hardmasks be patterned to a consistent critical dimension. Variations in critical dimensions or size of the hardmasks can result in non-uniformity within the formed emitter tips.

One method for fabricating the hardmask utilized to form the emitter tips uses spheres or beads as the mask for creating the hardmask layer mask. The spheres are provided in a liquid medium such as water. The emitter substrate is dipped into a vat of solution containing the spheres. The substrate is then withdrawn from the solution and some of the spheres adhere to the emitter substrate.

It is preferred to achieve a homogeneous/uniform distribution of beads upon the face of the emitter material. However, homogeneous distribution has been difficult to achieve. A non-uniform distribution of beads can result in adjacent spheres touching and subsequent adjoining of emitter tips following emitter fabrication causing problems with electron optics (e.g., focusing of electrons). Such joining of emitter tips can result in the emission of electrons which strike adjacent phosphor patches resulting in poor color intensity and poor color distribution.

Further, the spheres may exhibit poor adhesion to the surface of the substrate when conventional methods of applying the spheres to the substrate surface are utilized. This drawback is particularly acute if the spheres are larger than 0.5 microns.

The present invention provides improvements in device fabrication while avoiding problems experienced in the prior art.

SUMMARY OF THE INVENTION

The present invention includes structures, lithographic mask forming solutions, and mask forming methods. The invention further includes field emission display emitter mask forming methods and methods of forming plural field emission display emitters.

One aspect of the present invention provides a lithographic mask forming solution. The solution includes a photosensitive material and a plurality of masking particles within the photosensitive material. The photosensitive material comprises photoresist and the masking particles comprise beads or spheres in exemplary embodiments. The photosensitive material is cured and portions of the cured photosensitive material are removed in preferred aspects of the invention. Masking particles remaining upon the substrate are thereafter used as a mask to process a substrate. Uncured photosensitive material is used to improve adhesion of masking particles to the substrate to be processed.

A second aspect of the invention provides a structure forming method including providing a solution comprising a photosensitive material and a plurality of masking particles. The method also provides applying the solution over a substrate and removing at least a portion of the photosensitive material while leaving the masking particles over the substrate. The solution is preferably screen printed. The method also includes processing the substrate using the masking particles as a mask.

According to another aspect, a method of forming a mask over a substrate includes forming a masking layer over a surface of a substrate. Masking particles are screen printed over a surface of the masking layer and portions of the masking layer are removed using the masking particles. The removing of portions of the masking layer forms a mask. This mask includes a plurality of circular masking elements in some embodiments.

In another aspect, masking particles are mixed within photoresist to form a solution which can be screen printed. The screen printing includes printing masking particles within the solution containing photoresist. In one embodiment, the solution has a concentration within the approximate range of approximately $1 \times 10^8 - 1 \times 10^9$ masking particles per milliliter of photoresist.

It is preferred to provide a uniform layer of masking particles upon the masking layer. To this end, screen printing of masking particles guides the masking particles to predefined regions over the substrate. Further, the masking particles are preferably agitated to space the masking particles from one another.

In some aspects of the invention, the solution is permitted to cure and portions of the photoresist or other photosensitive material is removed. The masking particles form a mask utilized to form a hardmask from the masking layer. The_ hardmask is subsequently utilized to form a random array of emitters of a field emission display from an emitter substrate.

BRIEF DESCRIPTION OF THE DRAWINGS

Preferred embodiments of the invention are described below with reference to the following accompanying drawings.

FIG. 7 is a diagrammatic representation of contact screen printing.

FIG. 8 is a top plan view of a predefined region shown at the processing step of FIG. 5.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The present application is described with reference to fabrication techniques for structures which comprise electronic components or devices. Exemplary electronic components are fabricated from semiconductive substrates or substrates for flat panel or field emission display (FED) devices. Such substrates can comprise silicon, glass, quartz or other materials. Structures are processed and subsequently utilized in electronic devices of various configurations.

During formation of structures such as semiconductive components or FED emitters, it is often necessary to form masks for various processing steps. The masks can be utilized to process into a substrate or form additional layers upon the substrate. Certain aspects of the present invention are directed towards the formation of lithographic masks and the formation of solutions utilized to form lithographic masks.

Figure 1:
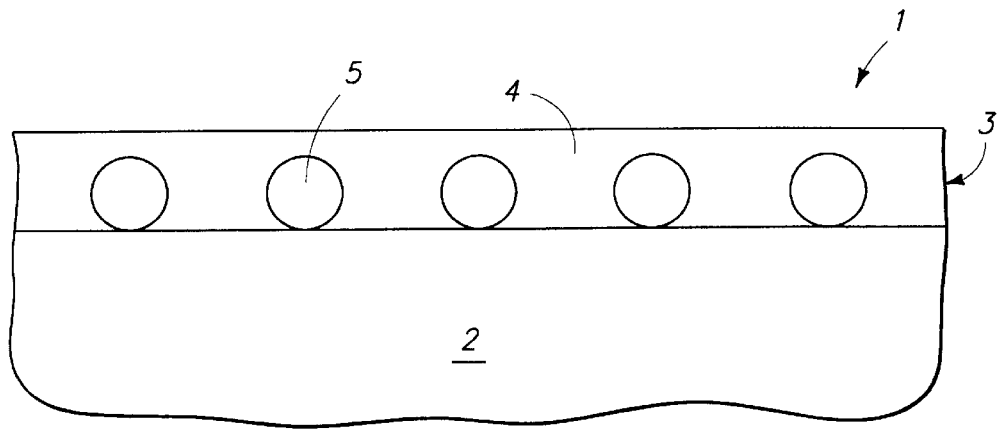
FIG. 1 is a cross-sectional view of a structure including a substrate and a solution layer during processing of the structure.

Referring to FIG. 1, a structure 1 is illustrated. Processing of structure 1 is described with reference to formation of an electronic device or component. For example, structure 1 is processed to comprise a transistor, memory cell, discrete component, such as a resistor or FED emitters in exemplary applications. Structure 1 is fabricated for use in electronic devices in some applications.

The depicted structure 1 comprises a substrate 2 and a solution layer 3 formed over substrate 2. Substrate 2 comprises a semiconductive substrate, such as monocrystalline silicon, in some embodiments. In particular, substrate 2 can comprise a field emission display substrate as described below. Alternatively, substrate 2 comprises other materials suitable for forming electronic devices or components.

Solution layer 3 comprises a medium 4 and a plurality of masking particles 5 within medium 4. In a preferred embodiment, medium 4 comprises a photosensitive resin or material. Solution layer 3 can be formed to comprise the same solution layer as described below with reference to FIG. 5 (i.e., solution layer 42). Utilizing such a solution, masking particles 5 comprise spheres and photosensitive material 4 comprises photoresist. The solution is formed in the exemplary embodiment to have a concentration within an approximate range of $1\times10^8$–$1\times10^9$ masking particles per milliliter of photosensitive material or photoresist.

In the presently described embodiment, solution layer 3 can be applied over substrate 2 by any suitable method, such as screen printing. Conventional offset and contact screen printing methods are described below with reference to FIG. 6 and FIG. 7. Such printing techniques are utilized in exemplary processing methods to form solution layer 3. As described in detail below, screen printing solution layer 3 is preferred to provide a uniform distribution of spheres within layer 3 and over substrate 2.

Following provision of solution layer 3 over substrate 2, medium 4 comprising photosensitive material is cured or developed. Exemplary curing methods include exposing solution layer 3 to ultraviolet light if medium 4 comprises positive photoresist.

Figure 2:
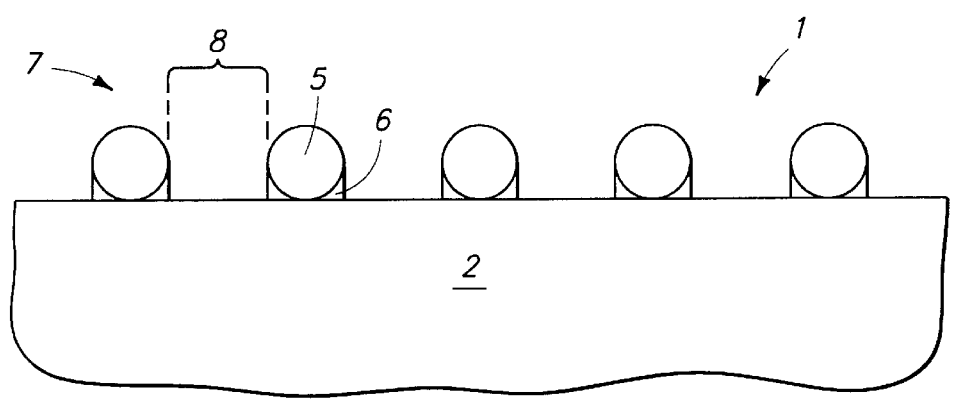
FIG. 2 is a cross-sectional view of a processing step of the structure subsequent to the step of FIG. 1.

Referring to FIG. 2, portions of photosensitive medium 4 are removed following curing of exposed portions of medium 4. In particular, cured portions of photosensitive material 4 can be stripped or otherwise removed. Masking particles 5 remain over substrate 2 following the removal of cured portions of medium 4.

Feet or small portions 6 of photosensitive medium 4 remain intermediate individual masking particles 5 and substrate 2 following removal of exposed portions of the photosensitive material. Uncured remaining resin feet 6 assist with adhering respective masking particles 5 to substrate 2.

Removal of exposed portions of photosensitive medium 4 forms a mask 7 comprising masking particles 5 and feet 6. Mask 7 comprises a lithographic mask for processing of structure 1 in the described embodiment. In particular, masking particles 5 and corresponding feet 6 of mask 7 define exposed regions 8 upon substrate 2. Exposed regions 8 of substrate 2 can be processed in subsequent fabrication steps.

Figure 3:
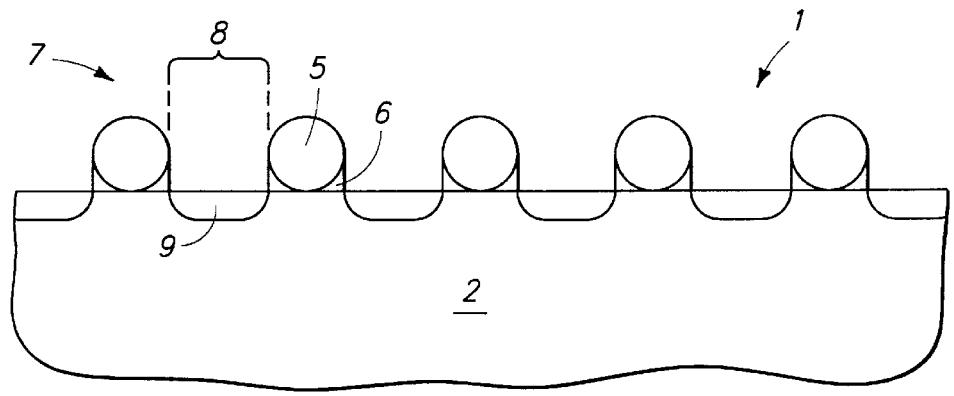
FIG. 3 is a cross-sectional view of a processing step of the structure subsequent to the step of FIG. 2.

Referring to FIG. 3, an exemplary fabrication step of structure 1 is described. In particular, substrate 2 is processed using masking particles 5 and feet 6 of mask 7 as a lithographic mask. In FIG. 3, plural diffusion regions 9 are formed within substrate 2. Exemplary diffusion regions can comprise p type or n type diffusion regions depending upon the particular structure 1 being processed.

Such diffusion processing is exemplary and other processing steps such as deposition can occur using mask 7. Following formation of diffusion regions 9, or other alternative processing, masking particles 5 and feet 6 can be stripped from substrate 2. Acetone is utilized in one embodiment to strip masking particles 5 and feet 6.

Referring to FIG. 4–FIG. 14, methods of forming masks are described with reference to field emission display devices. Further, methods of forming field emission display emitters are described. The invention is not limited to field emission display device fabrication as described in the following embodiments and applications. Aspects of the present invention described below might be utilized within any masking and etching process.

Figure 4:
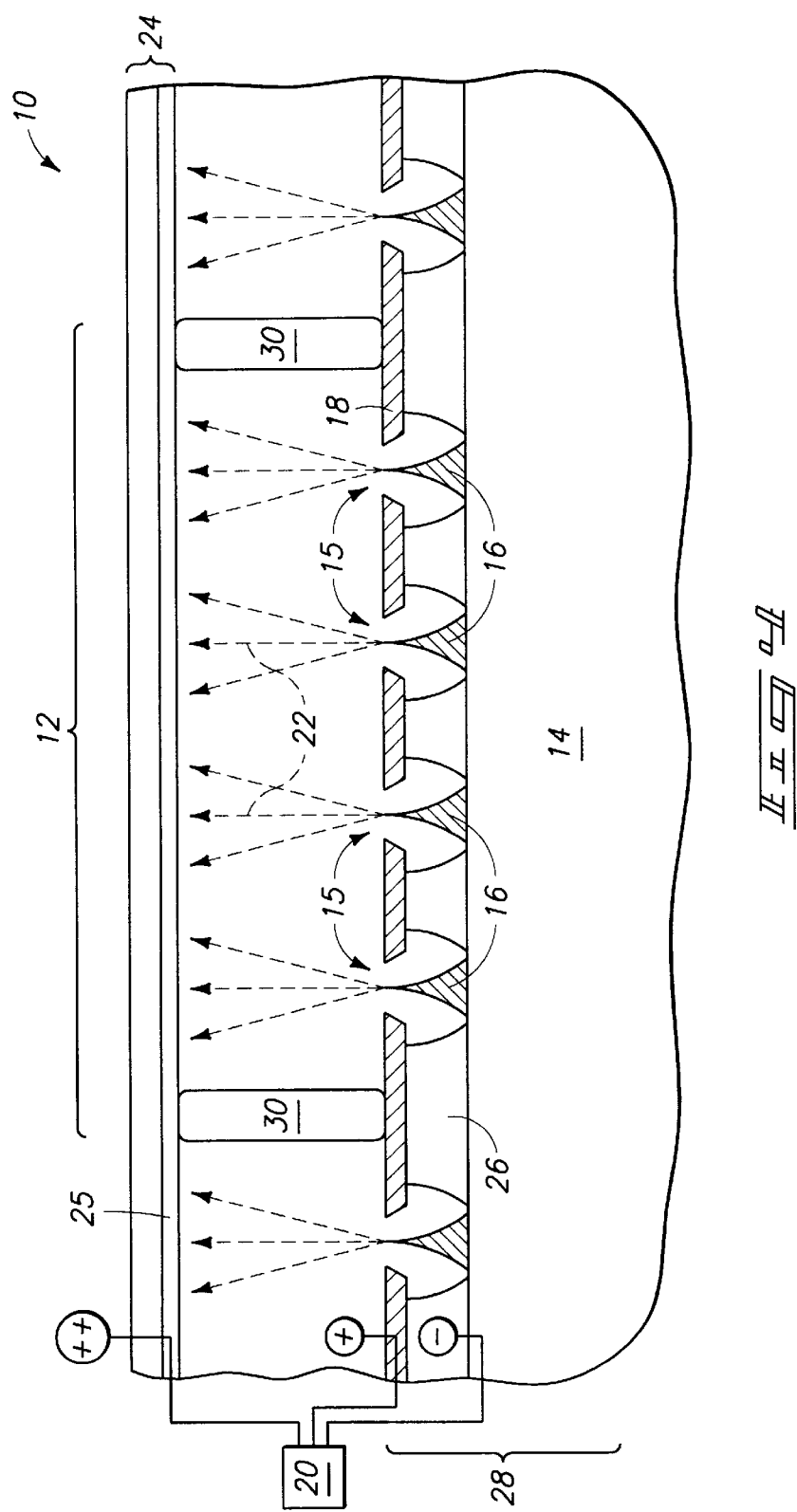
FIG. 4 is a cross-sectional view of a segment of a field emission display having plural emitters fabricated in accordance with processes of the present invention.

Referring to FIG. 4, an exemplary portion of a field emission display 10 is depicted. The illustrated portion of the field emission display 10 includes a display segment 12. Display segment 12 is capable of displaying a pixel of information, or a portion of a pixel. For example, display segment 12 may be configured to display one green dot of a red/green/blue full-color triad pixel. Field emission display 10 includes a faceplate or screen 24 and a cathode plate or baseplate 28 spaced therefrom. Support structures or separators 30 space faceplate 24 from baseplate 28 and generally define segment 12 in the illustrated embodiment.

Baseplate 28 of the described embodiment comprises a matrix addressable array of cathode emission structures or emitters 16. Baseplate 28 additionally includes an emitter substrate 14, upon which the emission structures 16 are created, a dielectric insulating layer 26, and an anodic grid 18.

Emitter substrate 14 has been patterned and etched to form micro-cathodes or emitters 16 as described in detail below. Display segment 12 includes plural field emission sites 15. Sites 15 correspond to the emitters 16. Dielectric insulating layer 26 is formed upon substrate 14 intermediate emitters 16 and sites 15. More specifically, insulator 26 has plural openings at the field emission sites 15. A vacuum is created between faceplate 24 and baseplate 28 to provide proper functioning of plural emitters 16 of the described field emission display 10. Separators 30 function to support atmospheric pressure which exists on electrode faceplate 24 as a result of the vacuum.

Emitters 16 are constructed on top of emitter substrate 14. Emitters 16 are integral with emitter substrate 14 and individually comprise a cathode for emission of electrons. Alternatively, emitters 16 form cathodes from one or more deposited conductive films, such as a chromium amorphous silicon bilayer. Emitters 16 preferably have a fine micropoint in the described embodiment.

Grid structure 18 surrounds emission sites 15 in the described embodiment. A power source 20 is utilized to apply a voltage differential between the cathodes (emitters 16) and anodic grid 18. In particular, emitters 16 are individually electrically coupled with a negative terminal of source 20. A positive terminal of source 20 is coupled with grid 18. Grid 18 serves as a structure for applying an electrical field potential to appropriate emitters 16. A stream of electrons 22 is emitted from emitters 16 responsive to the application of a voltage differential via grid 18.

A second positive terminal of source 20 is connected with faceplate 24 thereby forming another anode. Faceplate 24 includes a phosphor coating 25 over surface facing emitters 16. Electrons ejected from emitters 16 are aimed toward faceplate 24. Further details of field emission displays are described in U.S. Pat. Nos. 5,229,331 and 5,391,259, both incorporated herein by reference.

Figure 5:
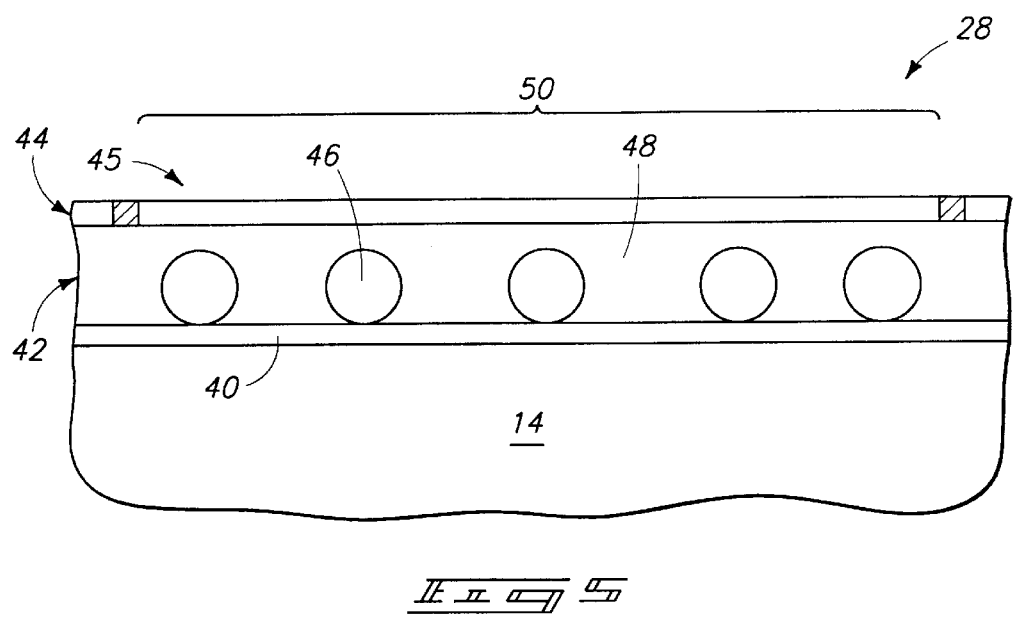
FIG. 5 is a cross-sectional view of a substrate, masking layer, layer of solution and a screen during fabrication of a backplate of a field emission display.

Referring to FIG. 5, fabrication of an exemplary portion of baseplate 28 of a field emission display is shown. In particular, methods of forming field emission display masks utilized for formation of emitters 16 are described. Methods of forming emission display emitters 16 are also described. The formed emitters 16 are conical in the described embodiment. Emitters 16 may comprise protuberances of other shapes in other embodiments.

The illustrated baseplate 28 includes emitter substrate 14, a masking layer 40 and a layer of solution 42. A single crystal silicon layer serves as substrate 14 in one embodiment. Amorphous silicon or polysilicon deposited upon a glass substrate are other examples. Other materials are utilized in other embodiments. In particular, substrate 14 of FIG. 5 can be any material from which emitters 16 can be fabricated.

Masking layer 40, also referred to as a hardmask layer, comprises a masking layer substrate which is deposited or grown on substrate 14 in the described embodiment. An example material for layer 40 is silicon dioxide. Masking layer 40 preferably has a thickness great enough to avoid being completely consumed during subsequent etching processes. It is also desired to provide a masking layer 40 which is not excessively thick so as to overcome adherent forces which maintain the masking layer in the correct position with respect to emitters 16 throughout the emitter fabrication process as described hereafter. An exemplary range of thicknesses of masking layer 40 is 0.05–0.5 microns with a thickness of 0.2 microns being preferred.

Solution layer 42 comprises a plurality of masking particles 46 within a medium 48. In one embodiment, masking particles 46 are initially mixed into a fairly viscous or thixotropic medium 48. Medium 48 is preferably liquid having an operable viscosity range from 10 to 1100 centipoise. A viscosity range from 40 to 200 centipoise is preferred at room temperature. Solution layer 42 is screen printed onto a surface of masking layer 40 and subsequently cured. As described below, medium 48 is thereafter removed providing an etch mask for fabricating another mask used to form a random array of field emitter tips (i.e., emitters).

Masking particles 46 preferably comprise spherical members and medium 48 comprises photoresist or photo sensitive material such as polyimide. Example materials are polystyrene or latex for spheres 46 and positive photoresist for medium 48. Masking particles 46 have an exemplary diameter of approximately one micron (0.04 mils). A preferred spherical diameter range is from 0.5 to 2.0 microns.

Masking members or particles 46 are typically provided in a water solution having a density of approximately $10^{11}$ beads or spheres per milliliter (ml) of solution. Exemplary bead solutions are available from Bangs Labs IDC Corp. The water solution containing the beads or masking particles 46 is dissolved in a carrier, such as isopropyl alcohol, and subsequently combined or mixed with photoresist in one embodiment of the invention. In one example, two cubic centimeters (cc) of isopropyl alcohol were added per one cubic centimeter of bead solution. Then, five cubic centimeters of photoresist were combined with this solution providing a ratio of 1:2:5 by volume. An exemplary ratio range of bead solution to isopropyl alcohol to photoresist is 1:(2 20):(5 50).

A 1:2:5 mixture of solution yields a bead or masking particle density of approximately $1.25 \times 10^{10}$ beads per milliliter of solution. An exemplary preferred concentration of masking particles 46 within medium 48 is within the approximate range of $1 \times 10^8$–$1 \times 10^9$ beads/ml immediately prior to screen printing upon hardmask masking layer 40.

In one example, approximately $1 \times 10^{11}$ spheres were mixed into approximately 300 ml of Olin HPR504 resist comprising medium 48. The solution containing spheres 46 and medium 48 was screen printed onto a glass substrate using conventional screen printing to form solution layer 42. A 400 mesh screen having a wire diameter of 0.00075 inches with a patterned emulsion coating of 0.0002 inches was utilized for the screen printing.

A screen 44 is utilized to screen print the solution layer 42 in accordance with the described embodiment of the present invention. It is desired to provide solution layer 42 upon masking layer 40 having a uniform density of masking particles 46. It is also preferred to provide spacing between adjacent masking particles 46.

Screen 44 includes plural mesh portions 45 (one whole mesh portion 45 is shown in FIG. 5). Mesh portions 45 of screen 44 define predefined regions 50 over masking layer 40 and emitter substrate 14 (one predefined region 50 corresponding to the illustrated mesh portion 45 is shown in FIG. 5). Screen 44 includes mesh portions 45 individually having dimensions of 1.75 mils by 1.75 mils square in one example. Screen 44 is thin as possible in preferred embodiments. An exemplary preferred thickness for a cured layer 42 is about five microns.

Figure 6:
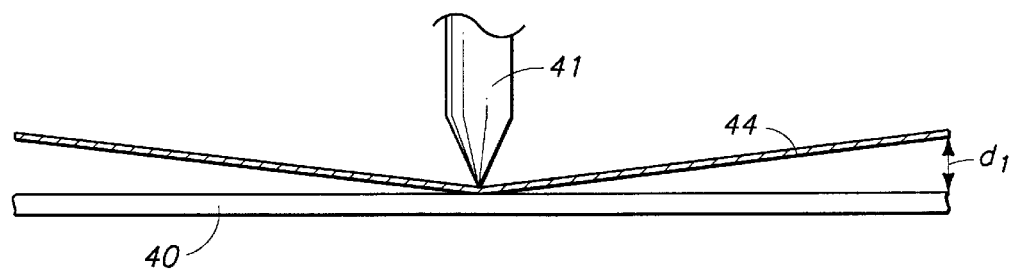
FIG. 6 is a diagrammatic representation of conventional offset screen printing.

Referring to FIG. 6, conventional offset screen printing of solution to form solution layer 42 is shown. A squeegee 41 is used to urge solution through mesh portions of screen 44. Solution is deposited onto screen 44 in front of the direction of travel of squeegee 41 in the described embodiment. Screen 44 and masking layer 40 are spaced by a distance $d_1$ (e.g., 0.04 inches). Squeegee 41 passes laterally over screen 44 and presses screen 44 to contact the layer being printed upon (e.g., masking layer 40). Squeegee 41 simultaneously forces the solution containing masking particles through mesh portions of screen 44.

Referring to FIG. 7, contact printing of the solution to form solution layer 42 upon masking layer 40 is shown. Screen 44 contacts masking layer 40 when contact printing is utilized. Squeegee 41 passes laterally over screen 44 forcing the solution containing the masking particles through mesh portions of screen 44. Conventional offset printing is the preferred screen printing method.

Referring to FIG. 8, a top view of solution layer 42 and screen 44 are shown. Plural mesh portions 45 (shown in phantom) are defined by screen 44. Screen 44 also defines plural regions 50 over the masking layer and the emitter substrate (the emitter substrate and the masking layer are below solution layer 42 and not shown in FIG. 8). Predefined regions 50 correspond to mesh portions 45 in the illustrated embodiment. In accordance with one aspect of the present invention, mesh portions 45 of screen 44 operate to guide masking particles 46 to respective predefined regions 50 over emitter substrate 14 and masking layer 40. The prior art is not understood to disclose any mechanism to guide masking particles over the region(s) to be covered with masking particles.

FIG. 8 illustrates an exemplary number of masking particles 46 within respective predefined regions 50. More or less masking particles 46 can be provided within individual predefined regions 50. In a preferred embodiment, a two micron pitch of masking particles 46 is desired if masking particles 46 having a diameter of one micron are utilized. In this embodiment, the approximate number of masking particles 46 received through one mesh portion 45 is the area of the mesh portion in square microns divided by four. Further, FIGS. 5 and 8 diagrammatically illustrate screen printing of masking particles 46 and are not to scale.

Figure 9:
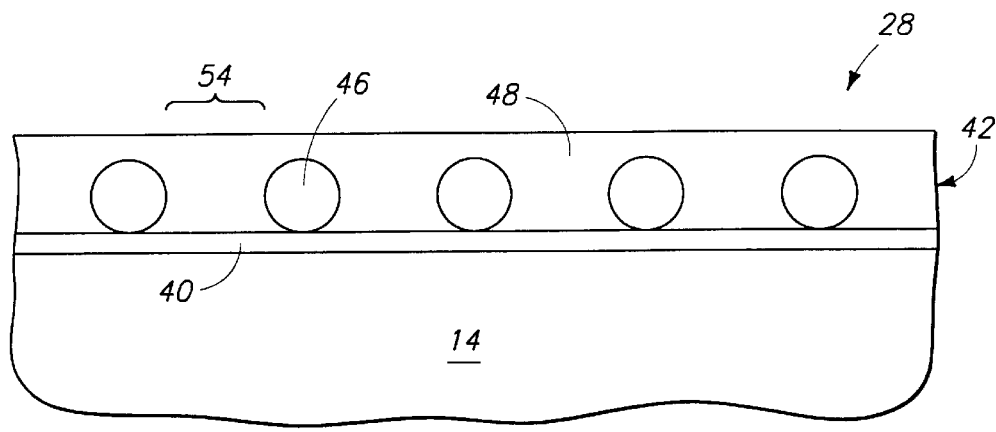
FIG. 9 is a cross-sectional view of a processing step for forming the backplate subsequent to the step of FIG. 5.

Referring to FIG. 9, screen 44 is removed from backplate segment 28 following formation of solution layer 42 over emitter substrate 14. Screen 44 is ideally removed before substantial curing of solution layer 42. Masking particles 46 and medium 48 flow to fill the void created by the removal of screen 44.

Backplate segment 28, including emitter substrate 14, masking layer 40 and solution layer 42, is preferably agitated following removal of screen 44 and prior to substantial curing. Such agitation encourages movement of masking particles 46 apart from one another and provides spacing intermediate adjacent masking particles 46. Such agitation also encourages settling of masking particles 46 upon masking layer 40. Masking particles 46 may also adhere to masking layer 40 following contacting of the same. Subsequently, solution layer 42 is cured. An example curing process includes air drying backplate 28 for twenty minutes in ambient air at 50% humidity. Masking particles 46 define intermediate portions 54 of medium 48 between adjacent masking particles 46.

Figure 10:
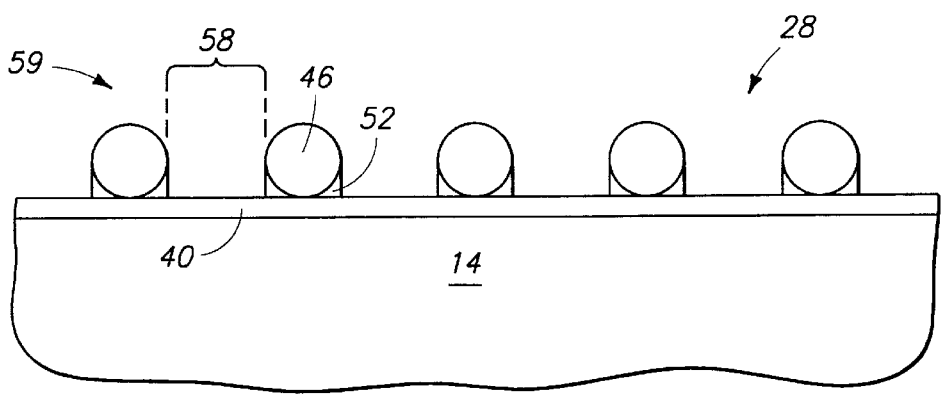
FIG. 10 is a cross-sectional view of a processing step of the backplate subsequent to the step of FIG. 9.

Referring to FIG. 9 and FIG. 10, following curing of solution layer 42, medium 48, including intermediate portions 54 thereof, is stripped or otherwise removed. In embodiments where medium 48 comprises positive photoresist, baseplate segment 28 is flood exposed to ultraviolet light and developed. Media 48, including intermediate portions 54, is thereafter stripped. A foot or small portion 52 of medium 48 can remain intermediate individual masking particles 46 and masking layer 40. Feet 52 of medium 48 are defined by the diameter of respective masking particles 46. Masking particles 46 preferably contact masking layer 40. Remaining portions of medium 48 or feet 52 assist with adhesion of bases of masking particles 46 to masking layer 40. Masking particles 46 and feet 52 form a mask 59 upon masking layer 40. In particular, masking particles 46 and feet 52 define plural exposed portions or regions 58 of masking layer 40.

Figure 11:
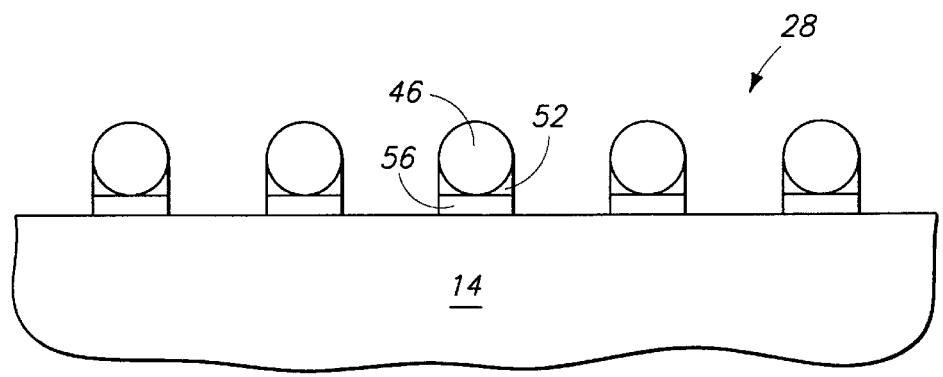
FIG. 11 is a cross-sectional view of a processing step of the backplate subsequent to the step of FIG. 10.

Referring to FIG. 10 and FIG. 11, exposed portions 58 of masking layer 40 are removed from emitter substrate 14 using spheres 46 as mask 59. In one embodiment, anisotropic etching is utilized. An example chemistry includes $CF_4$, $CHF_3$, $Ar_2$ as described in the '259 patent. Such removal of exposed portions 58 of masking layer 40 provides masking elements 56 beneath masking particles 46. Masking elements 56 substantially correspond to, or are defined by, the diameters of respective masking particles 46. Masking elements 56 are circular in the described embodiment. Utilization of masking particles 46 in accordance with the present invention improves critical dimension control while producing masking elements 56.

Figure 12:
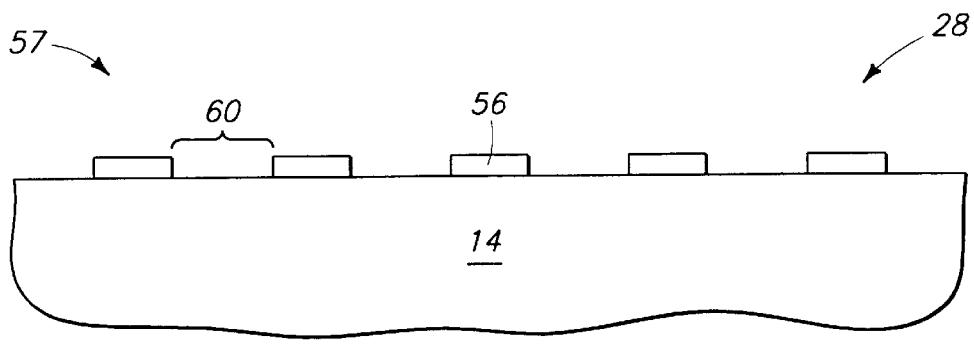
FIG. 12 is a cross-sectional view of a processing step of the backplate subsequent to the step of FIG. 11.

Referring to FIG. 12, the beads or masking particles and the feet have been stripped from masking elements 56. Acetone is utilized in one embodiment to strip the masking particles and feet. Masking elements 56 define a mask 57, which is also referred to herein as a hardmask. Masking elements 56 define exposed regions or portions 60 of emitter substrate 14. Exposed portions 60 are intermediate masking elements 56.

Figure 13:
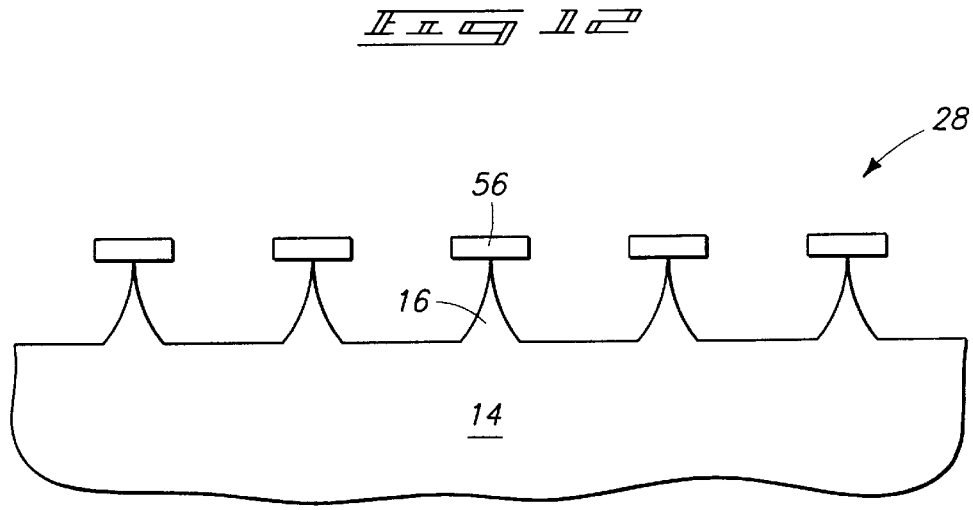
FIG. 13 is a cross-sectional view of a processing step of the backplate subsequent to the step of FIG. 12.

Referring to FIG. 13, portions of emitter substrate 14, including exposed portions 60, have been etched (preferably substantially isotropically) to form plural emitters 16. An example etching chemistry is $SF_6$, $Cl_2$, He as set forth in the '259 patent. Emitters 16 are formed corresponding to circular masking elements 56. A timed etch is utilized to form emitters 16 in one embodiment.

Figure 14:
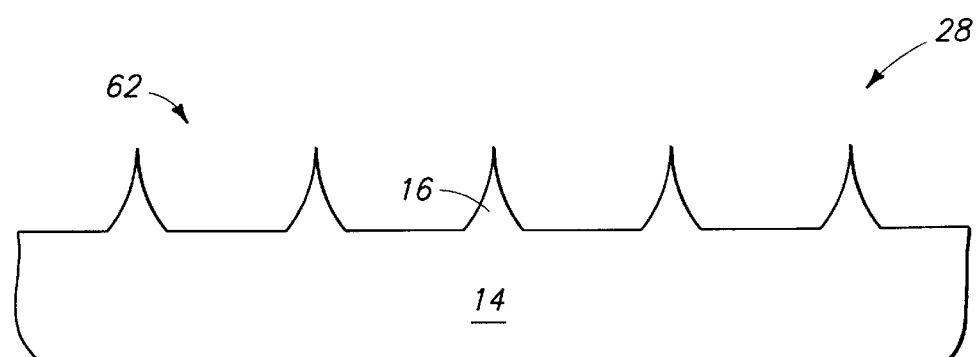
FIG. 14 is a cross-sectional view of emitters formed from an emitter substrate of a field emission display in accordance with the present invention.

Referring to FIG. 14, a substantially uniform array 62 of emitters 16 is shown upon emitter substrate 14. The insulating dielectric layer may be subsequently formed to fabricate the backplate 28 shown in FIG. 4. Additionally, the anodic grid may be provided enabling control of the emission of electrons from emitters 16.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed:

1. A structure comprising:

a substrate;

a layer of solution provided over the substrate, the solution comprising a photosensitive material and a plurality of masking particles, wherein substantially all of the masking particles in contact with the photosensitive material are provided being spaced a common distance from a surface of the substrate; and a screen configured to direct the masking particles to predefined regions over the substrate.

2. The structure according to claim 1 wherein the substrate comprises a field emission display substrate.

3. The structure according to claim 1 wherein the photosensitive material comprises photoresist.

4. The structure according to claim 1 wherein the substrate comprises a field emission display substrate and the photosensitive material comprises photoresist.

5. A structure forming method comprising:

providing a solution including photosensitive material and a plurality of masking particles;

applying the solution over a substrate;

agitating the plurality of the masking particles to settle the masking particles over the substrate;

removing at least a portion of the photosensitive material while leaving the masking particles over the substrate; and processing the substrate using the masking particles as a mask.

6. The method according to claim 5 wherein the applying comprises screen printing the solution over the substrate.

7. The method according to claim 5 wherein the substrate comprises a field emission display substrate.

8. The method according to claim 5 wherein the substrate comprises a semiconductive substrate.

9. The method according to claim 5 wherein the method comprises an electronic device forming method.

10. The method according to claim 5 further comprising adhering the masking particles over the substrate using the photosensitive material.

11. The method according to claim 5 further comprising removing the masking particles following the processing.

12. The method according to claim 5 wherein the providing comprises providing a solution including photosensitive material comprising photoresist.

13. A structure forming method comprising:

providing a solution including photosensitive material and a plurality of masking particles within the photosensitive material;

screen printing a layer of the solution over a substrate;

curing at least a portion of the photosensitive material screen printed over the substrate;

removing cured photosensitive material while leaving the masking particles over the substrate; and processing the substrate using the masking particles as a mask.

14. The method according to claim 13 wherein the substrate comprises a field emission display substrate.

15. The method according to claim 13 wherein the substrate comprises a semiconductive substrate.

16. The method according to claim 13 further comprising adhering the masking particles over the substrate using the photosensitive material.

17. The method according to claim 13 further comprising removing the masking particles following the processing.

18. The method according to claim 13 wherein the providing comprises providing a solution including photosensitive material comprising photoresist.

19. The structure according to claim 1 wherein the substrate comprises a semiconductive substrate.

20. The structure according to claim 1 wherein substantially all of the masking particles contact the surface of the substrate.

21. The method according to claim 13 wherein the screen printing comprises physically contacting a screen with a squeegee to urge the masking particles through the screen.

22. The method according to claim 13 wherein the screen printing comprises offset printing.

23. The method according to claim 13 wherein the screen printing comprises contact printing.

* * * * *